(12) United States Patent
Roberts et al.

(10) Patent No.: US 6,396,336 B2
(45) Date of Patent: May 28, 2002

(54) SLEEP MODE VDD DETUNE FOR POWER REDUCTION

(75) Inventors: Alan L. Roberts, Jerico; Reid A. Wistort, Westford, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/883,048

(22) Filed: Jun. 15, 2001

Related U.S. Application Data

(62) Division of application No. 09/433,279, filed on Nov. 3, 1999, now Pat. No. 6,333,671.

(51) Int. Cl.⁷ .............................. G05F 1/10; G05F 3/02
(52) U.S. Cl. ...................................... 327/544; 365/227
(58) Field of Search ................................ 327/544–546; 365/226, 227, 229

(56) References Cited

U.S. PATENT DOCUMENTS

| | | | |
|---|---|---|---|
| 4,130,899 A | 12/1978 | Bowman et al. | 365/222 |
| 4,683,382 A | 7/1987 | Sakurai et al. | 327/544 |
| 4,691,123 A * | 9/1987 | Hashimoto | 327/546 |
| 4,716,463 A | 12/1987 | Stacy et al. | 348/730 |
| 5,077,518 A * | 12/1991 | Han | 323/275 |
| 5,477,279 A | 12/1995 | Chang | 348/730 |
| 5,511,026 A | 4/1996 | Cleveland et al. | 365/189.01 |
| 5,530,398 A | 6/1996 | Shamlou et al. | 327/545 |
| 5,663,919 A | 9/1997 | Shirley et al. | 365/226 |
| 5,747,977 A | 5/1998 | Hwang | 323/284 |
| 5,773,966 A | 6/1998 | Steigerwald | 323/284 |
| 5,898,235 A * | 4/1999 | McClure | 307/64 |
| 6,049,245 A * | 4/2000 | Son et al. | 327/544 |
| 6,118,267 A * | 9/2000 | Eitan et al. | 323/364 |

FOREIGN PATENT DOCUMENTS

JP 6-175956 6/1994

* cited by examiner

Primary Examiner—Toan Tran
Assistant Examiner—Quan Tra
(74) Attorney, Agent, or Firm—Robert A. Walsh

(57) ABSTRACT

The leakage current on a semiconductor is reduced while the semiconductor is in a sleep mode. This is accomplished by (1) placing the semiconductor in the sleep mode; (2) providing the semiconductor an internal supply voltage derived from an external supply voltage applied to the semiconductor chip (where the internal supply voltage is less in quantity than the external supply voltage); and (3) reducing the internal supply voltage when the semiconductor enters the sleep mode from an activated mode and returning the internal supply voltage to an activated mode level when the semiconductor returns to the activated mode. The reducing step includes supplying the external supply voltage to a reference circuit which outputs therefrom a reference voltage; and supplying the reference voltage to a regulator, where the regulator attempts to match the reference voltage and outputs therefrom the internal supply voltage. The reference circuit reduces the reference voltage when the semiconductor enters the sleep mode from an activated mode and returns the reference voltage to the activated mode level when the semiconductor returns to the activated mode. The reducing step can be performed by reducing the current flow to one or more diodes in the reference circuit when the semiconductor enters the sleep mode from the activated mode, and increasing the current flow to the diodes when the semiconductor reenters the activated mode from the sleep mode.

3 Claims, 4 Drawing Sheets

SLEEP MODE VDD DETUNE FOR POWER REDUCTION

This application is a division of application Ser. No. 09/433,279, filed Nov. 3, 1999, which is now Ser. No. 6,333,671.

BACKGROUND OF THE INVENTION

1. Field of the Invention

The following invention relates generally to network semiconductor chips and specifically to sleep mode circuitry in semiconductor chips.

2. Related Art

In recent times, conservation of energy to semiconductor chips has become increasingly important. In fact, it is a standard feature that three power modes are provided: a select (or on) state, a deselect (or off) state, and a sleep mode state. In the sleep mode, the energy of the chip is conserved from the normal on state. In this sleep mode, while the voltage to the individual transistors is not low enough to lose memory (as when the power is turned off in the deselect state), the voltage is turned down to conserve energy as compared to the select state. The power conservation function of the sleep mode is especially important for portable devices, such as laptop computers.

One concern for chip designers is to decrease the leakage current across the individual transistors in the sleep mode. For a typical semiconductor chip, an external power supply supplies on the order of a few volts of power (e.g., 2.5 to 3 volts) to the chip. This external voltage is fed to regulators, and scaled down in power to one or more actual (internal) voltages used by the internal memory devices of the chip. At the present generation of technology, an internal voltage of approximately 1.9 volts is considered standard.

With a high density memory chip, typically millions of transistors are arranged in memory cells, with word lines, plate lines and bit lines used for reading and writing to these memory cells. These memory cells are supplied by the internal voltages.

Unfortunately, each of these transistors leak a small amount current when the chip is in the deselect or sleep mode states. In the sleep mode state, the leakage is on the order of a few picoamps for example. Although the leakage current for each transistor is negligible, the amount of leakage is significant when the tremendous number of transistors is taken into consideration.

To reduce the leakage while in the sleep mode, it is possible to turn off the outputs from a number of the regulators. However, this does not solve the problem because the amount of internal voltage is not reduced, causing the same amount of leakage current to be drawn in the arrays of memory cells.

A number of techniques have been used to decrease the leakage current. One technique has been to change the physical characteristics of individual transistors and memory cells. For example, it is possible to raise the threshold voltage for the transistors and/or increase the device lengths (channel lengths) of the transistors. This technique has the disadvantage of deleteriously affecting active-mode (on state) chip performance, and possibly increasing the size of the chip. In addition, these changes would be fixed and permanent.

Another technique has been to add threshold implants (i.e., implant more atoms). This can deleteriously impact the physical characteristics of the transistors when the chip is returned to the on state. Again, these changes would be fixed and permanent.

Another technique is to add additional circuit elements, to block the flow of currents unneeded in the sleep mode, such as turning off redundant charge pumps. For example, specially tailored transistors can be used, which would receive signals to restrict the flow of current during sleep mode. Unfortunately, this technique can adversely impact chip performance and can add additional process steps. In addition, it would provide a fixed and permanent change to the chip as well.

What is needed is a method for decreasing the leakage current by lowering the internal voltage. In particular, what is needed is to lower the leakage current without the disadvantages of prior techniques, such as affecting the size and shape of the transistors, adding implants, or selectively disabling chip subsystems.

SUMMARY OF THE INVENTION

The present invention is directed to a system and method for reducing a leakage current on a semiconductor in a sleep mode. The method includes (1) placing the semiconductor in the sleep mode; (2) providing the semiconductor an internal supply voltage derived from an external supply voltage applied to the semiconductor chip (where the internal supply voltage is less in quantity than the external supply voltage); and (3) reducing the internal supply voltage when the semiconductor enters the sleep mode from an activated mode and returning the internal supply voltage to an activated mode level when the semiconductor returns to the activated mode. The reducing step includes supplying the external supply voltage to a reference circuit which outputs therefrom a reference voltage; and supplying the reference voltage to a regulator, where the regulator attempts to match the reference voltage and outputs therefrom the internal supply voltage. The reference circuit reduces the reference voltage when the semiconductor enters the sleep mode from an activated mode and returns the reference voltage to the activated mode level when the semiconductor returns to the activated mode.

The reducing step can be performed by reducing the current flow to one or more diodes in the reference circuit when the semiconductor enters the sleep mode from the activated mode, and increasing the current flow to the diodes when the semiconductor reenters the activated mode from the sleep mode. In one embodiment, this is accomplished by turning one or more transistors controlling the flow of current to the diodes off when the semiconductor enters the sleep mode from the activated mode, and turning the transistors back on when the semiconductor reenters the activated mode from the sleep mode. The transistors can be turned on and off by preprogrammed signals transmitted from a control circuit.

BRIEF DESCRIPTION OF THE FIGURES

The present invention will be described with reference to the accompanying drawings, wherein.

In the figures, like reference numbers generally indicate identical, functionally similar, and/or structurally similar elements. The figure in which an element first appears is indicated by the leftmost digit(s) in the reference number.

DETAILED DESCRIPTION OF THE PREFERRED EMBODIMENTS

In the following description of the preferred embodiments, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
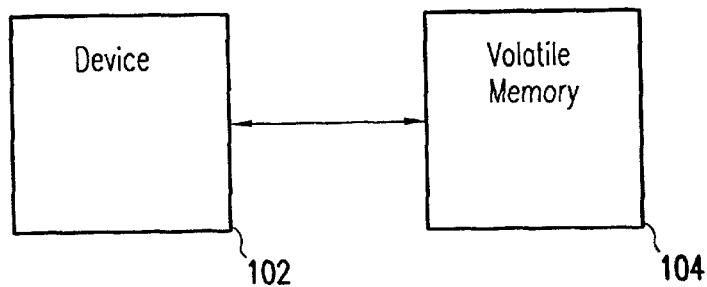
FIG. 1 is a block diagram illustrating a device coupled to a volatile memory.

FIG. 1 is a block diagram illustrating device 102 coupled to volatile memory 104. Device 102 includes a microprocessor, memory controller, chip set or other comparable devices. Volatile memory 104 includes an array of memory cells comprising transistors, used to dynamically store data. Device 102 and memory 104, and the coupling therebetween, are illustrated in detail below.

Figure 2:
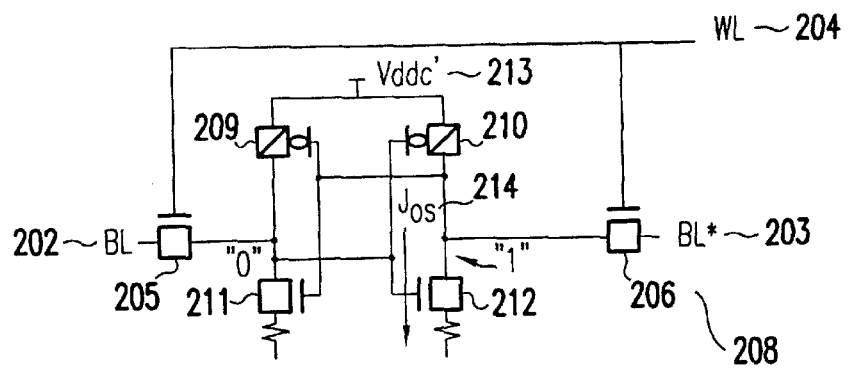
FIG. 2 illustrates an exemplary memory cell housed in a volatile memory.

FIG. 2 illustrates an exemplary memory cell 208, housed in volatile memory 104. Specifically, memory cell 208 is an SRAM, comprising two CMOS inverters. The first CMOS inverter comprises PFET 209 and NFET 211. The second CMOS inverter comprises PFET 210 and NFET 212. FIG. 2 also includes NFET 205, with a gate coupled to word line 204, a source/drain region coupled to bit line 202, and a source/drain region coupled to the first CMOS inverter. FIG. 2 also includes NFET 206, with a gate coupled to word line 204, a source/drain region coupled to bit line complement 203 (having a complementary logical state to bit line 202), and a source/drain region coupled to the second CMOS inverter. As those skilled in the art will recognize, any variety of different transistors and line designations can be used without departing from the scope of the present invention. FIG. 2 also includes voltage $V_{ddc}$, and a leakage current $J_{DS}$, which runs down the CMOS inverters.

Figure 3:
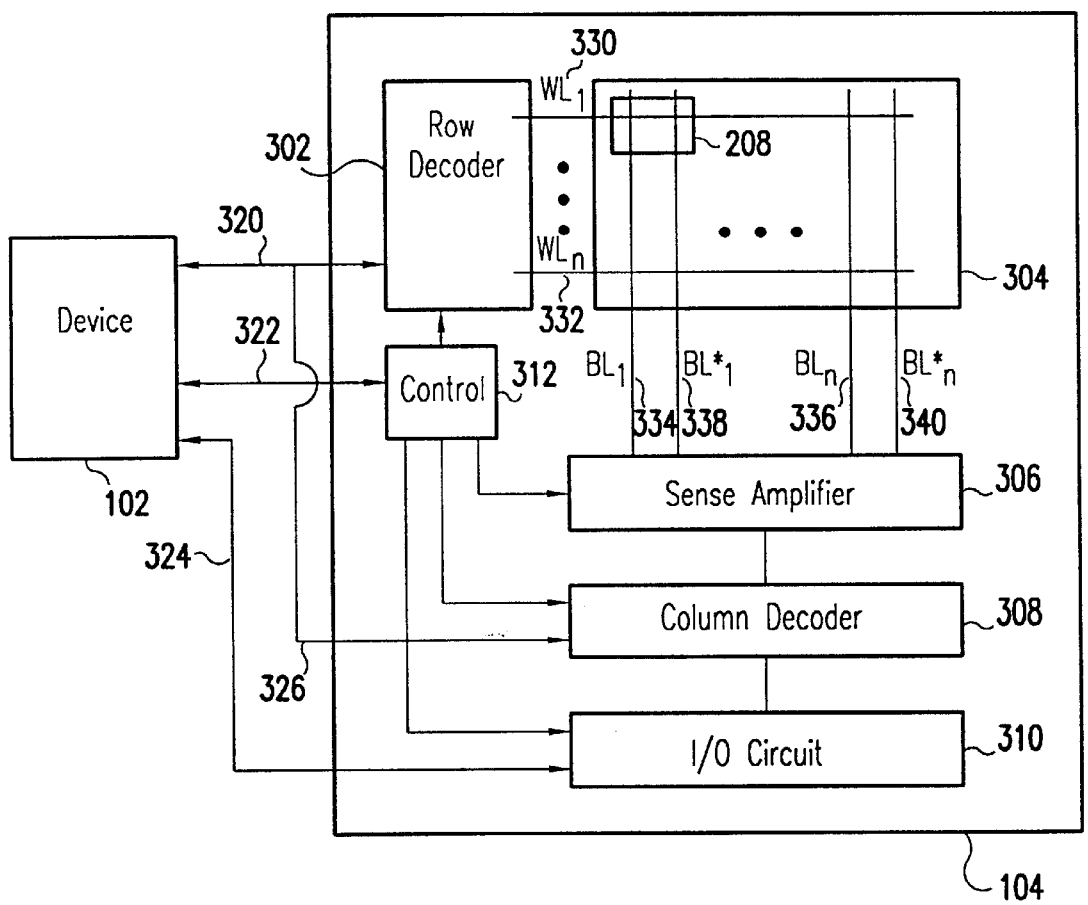
FIG. 3 illustrates a detailed view of a device, a volatile memory, and the coupling therebetween.

FIG. 3 illustrates a detailed view of device 102, volatile memory 104, and the coupling therebetween. Volatile memory 104 includes row decoder 302, memory cell array 304, sense amplifier 306, column decoder 308, input/output (I/O) circuit 310 and control circuit 312.

Memory cell array 304 includes a plurality of exemplary memory cells 208, with word lines $WL_1$ 330–$WL_n$ 332, bit lines $BL_1$ 334 $BL_n$ 336, and bit line complements $BL_1$* 338–$BL_n$* 340. For each memory cell in memory cell array 304, the word lines, bit lines and bit line complements are similarly coupled as illustrated with respect to FIG. 2.

Device 102 reads information from and writes information to volatile memory 104. Reading and writing to memory cell 208 is presented herein. For reading, device 102 provides the address of memory cell 208 to row decoder 302 over address line 320. Additionally, device 102 provides control signals to control circuit 312 over line 322. In turn, control circuit 312 signals sense amplifier 306 to equilibrate voltages on bit line 334 and bit complement line 338. This causes lines 334 and 338 to achieve a common voltage, between a high and a low value. Row decoder 302 then drives word line 330 to a voltage above a threshold voltage, setting bit line 334 to a logical value, and bit complement line 338 to the opposite value. Next, sense amplifier 306 senses and amplifies the value on the bit line/complement bit line pair (334 and 338), stores the logic levels, and passes them to device 102 via I/O circuit 310 and input/output line 324.

For writing, device 102 provides data to be written to memory cell array 304 by way of input/output line 324 and I/O circuit 310. Column decoder 308 receives a column address from device 102 over line 326. This address indicates the memory cell to be written to via its bit line/complement bit line address. Sense amplifier 306, according to the control of control circuit 312, sets the bit line/complement bit line address for the memory cell to the logic levels indicated by column decoder 308. Under the direction of control circuit 312, row decoder 302 indicates the memory cell to be written to via its word line address. The word line is activated, and the memory cell forces data on the bit line/complement bit line pair to be stored by the memory cell.

Memory cell array 304 and, therefore, volatile memory 104, include many transistors. In fact, the number of transistors can number in the many millions. Each transistor has a leakage current, similar to leakage current $J_{DS}$ for memory cell 208. The combination of these leakages leads to a drain of power resources on the chip.

Figure 4:
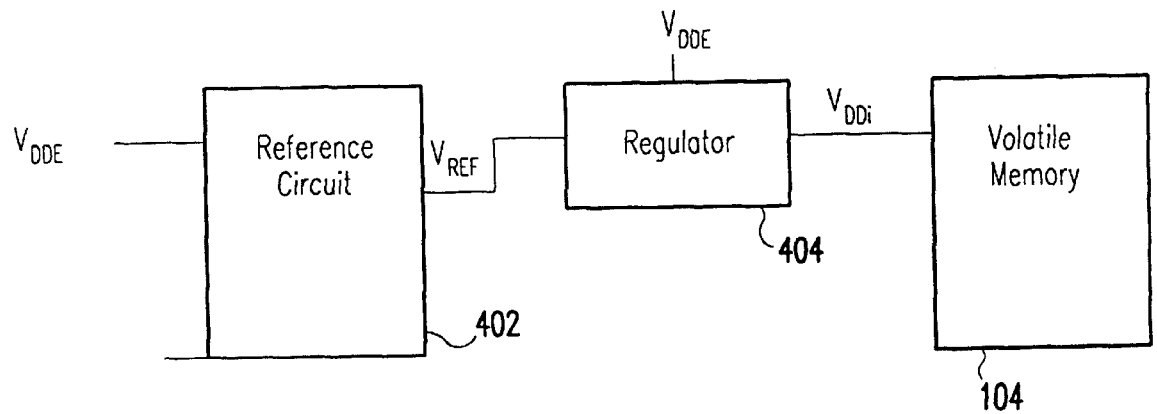
FIG. 4 illustrates a power sources providing power to a volatile memory.

FIG. 4 illustrates the power sources providing power to volatile memory 104. FIG. 4 includes reference circuit 402, regulator 404, and volatile memory 104. FIG. 4 also includes external voltage supply $V_{DDE}$, reference voltage $V_{REF}$, and internal voltage supply $V_{DDI}$.

$V_{DDE}$ is an external voltage supplied to the chip. For example, $V_{DDE}$ is a direct current constant output voltage supplied from a battery. Reference circuit 402 uses $V_{DDE}$ to derive a reference voltage $V_{REF}$ for regulator 404. In actuality, regulator 404 is a portion of a regulator circuit whose specific function is to regulate the voltage applied to volatile memory 104. Regulator 404 is a voltage follower circuit, making its output $V_{DDI}$ match $V_{REF}$. $V_{DDI}$, itself, is the internal chip voltage, which is the input voltage applied to volatile memory 104.

Figure 5:
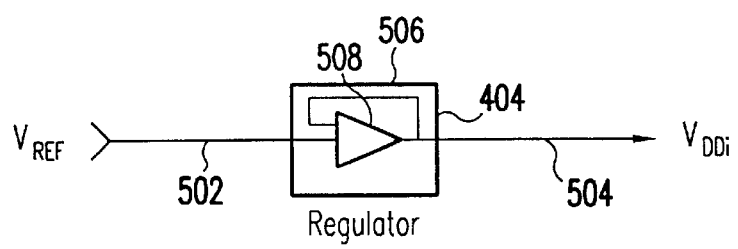
FIG. 5 illustrates an exemplary regulator.

FIG. 5 illustrates an exemplary regulator 404. FIG. 4 includes $V_{REF}$ input to regulator 404 over line 502, and $V_{DDI}$ output from regulator 404 over line 504. Regulator 404, which is in actuality the voltage regulation portion of a regulator, comprises voltage follower 508 receiving as inputs signal 502 and feedback 506, and transmitting as output signal 504. Those skilled in the art will recognize that regulator 404 is illustrated for exemplary purposes only, and not by way of limitation.

The present invention is directed to reducing the leakage currents of the many transistors of volatile memory 104, as well as the overall leakage for volatile memory 104 and the entire chip during the sleep mode. The present invention performs the sleep mode leakage reduction by reducing $V_{REF}$. This is performed without reducing the physical characteristics of the chip transistors or affecting chip performance in the on state (i.e., when volatile memory 104 is turned back on after the sleep mode).

Figure 6:
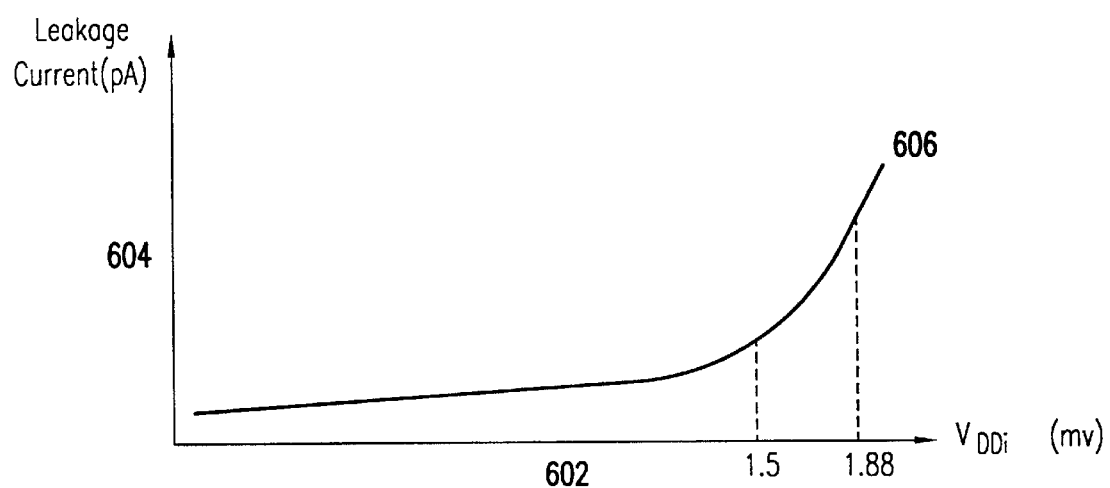
FIG. 6 illustrates improved leakage characteristics of volatile memory transistors from use of the present invention.

FIG. 6 illustrates the improved leakage characteristics of the transistors from using the invention. Referring back to FIG. 2, in each memory cell 208, there is an undesirable low-level leakage current $J_{DS}$ when the transistor is in the off state. It is this leakage current that adversely consumes the power supplied by $V_{DDE}$. FIG. 6 illustrates leakage current 604 (in picoamps) as a function of internal voltage supply $V_{DDI}$ (in volts), labeled 602. As shown, by decreasing $V_{DDI}$ from the order of 1.9 to 1.5, the leakage current is significantly decreased (approximately exponentially). Experimental results have shown a 20 percent reduction of total leakage.

Figure 7:
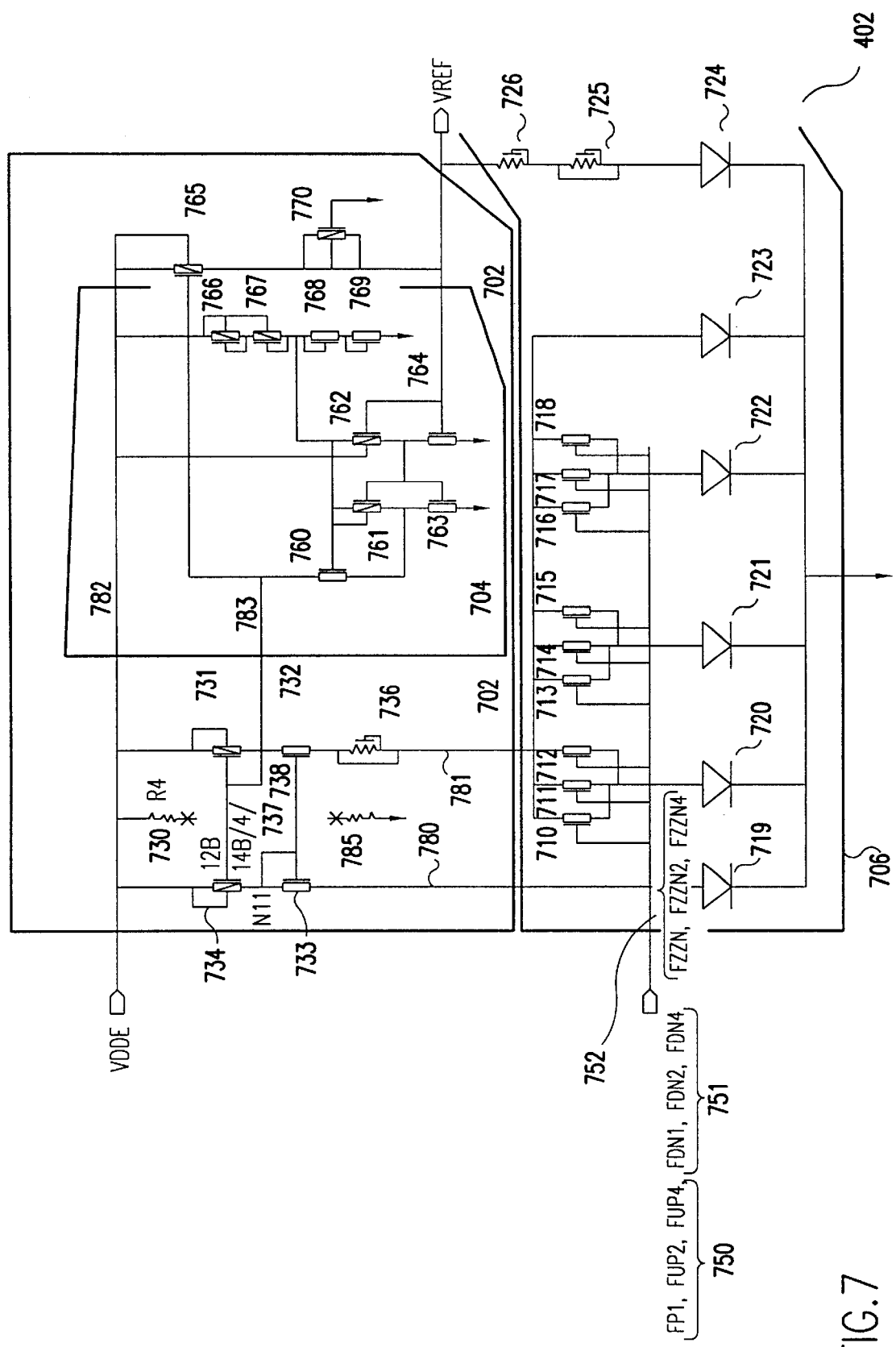
FIG. 7 is a schematic representation of one embodiment of reference circuit used in the present invention.

FIG. 7 is a schematic representation of one embodiment of reference circuit 402. FIG. 7 is used to illustrate an exemplary technique used in the present invention for reducing $V_{REF}$, in order to decrease the internal voltage supply $V_{DDI}$.

FIG. 7 includes three circuit regions 702, 704 and 706. Region 702 is the portion of reference circuit 402 which performs voltage matching, as recognized by those skilled in the art. Region 702 includes NFETs 732, 733, PFETs 731, 734, and resistors 730, 735, 736, 765 and 770. Also shown are nodes N9 738 and N11 737. Region 702 receives $V_{DDE}$ as its input, and has output lines 780, 781 to region 706 and input lines 782, 783 to region 704. Those skilled in the art will recognize that the function of region 702 can be accomplished by a large variety of different circuit element arrangements, and that the present disclosure is not limiting.

Region 704 is a startup circuit as recognized by those skilled in the art. Region 704 includes NFETs 760, 763, 764, 768 and 769. Region 704 also includes PFETs 761, 762, 766, and 767. Region 704 receives input lines 782, 783 from region 702 and outputs $V_{REF}$. Those skilled in the art will also recognize that the function of region 704 can be accomplished by a large variety of different circuit element arrangements, and that the present disclosure is not limiting.

Region 706 is a circuit used to set the voltage levels for $V_{REF}$. Region 704 includes up voltage NFETs 710–712, down voltage NFETs 713–715, sleep mode NFETs 716–718, diodes 719, 723, 724, up voltage diode group 720 (representing 7 diodes), down voltage diode group 721 (representing 7 diodes), sleep mode diode group 722 (representing 10 diodes, and an additional diode group 723 (representing 3 diodes), and resistors 725, 726.

Region 706 receives three up voltage input line groups 750 (labeled FUP1, FUP2, FUP3), three down voltage input line groups 751 (labeled FDN1, FDN2, FDN3), and three sleep mode input line groups 752 (labeled FZZ1, FZZ2, FZZ3). Region 706 also receives inputs lines 780, 781 from region 702, and outputs $V_{REF}$. From the explanations provided below, those skilled in the art will also recognize that the function of region 706 can be accomplished by a large variety of different circuit element arrangements, and that the present disclosure is not limiting.

Each of the input lines of input line groups 750, 751 and 752 are preprogrammed signals transmitted from a control circuit to turn NFETS 710–718 on and off. In actuality, there are nine lines (FUP1, FUP2, FUP3, FDN1, FDN2, FDN3, FZZ1, FZZ2, and FZZ3), with each line turning a single NFET on or off. Each line can be programmed to turn any NFET on or off, but in the present embodiment, FUP1–FUP3 respectively turn NFETs 710–712 on and off, FDN1–FDN3 respectively turn NFETs 713–715 on and off, and FZZ1–FZZ3 respectively turn NFETs 716–718 on and off. As illustrated, the diode groups 720, 721 and 722 are turned on and off by NFET groups 710–712, 713–715 and 716–718, respectively.

By turning any of NFETs 710–718 off, it is possible to disable any of the diode groups 720 722, and thereby control the amount of current drawn over line 781 (from NFET 736). The lesser the current drawn over line 781, the lower a value for $V_{REF}$ is achieved. In fact, $V_{REF}$ is a function of the voltage at node N9 738. In this manner, the detune of $V_{REF}$ is achieved.

In one embodiment, when the chip enters the sleep mode, NFETs 716–718 are turned off. This reduces the current flow by blocking current flow over diode group 722. In turn, $V_{REF}$ is turned down during the sleep mode. As noted, regulator 404 causes $V_{DDI}$, the internal supply voltage supplied to volatile memory 104, to match (or closely track) $V_{REF}$. In empirical tests, $V_{REF}$ was found to be turned down from approximately 1.9 volts to approximately 1.5 volts, resulting in a per-transistor reduction in leakage current by a factor of 2, or a 20 percent decrease in overall sleep mode current.

When the chip is returned to the on state from the sleep mode, NFETS 716–718 are turned back on, permitting increased current flow through the diodes (specifically diode group 722), and therefore, through line 781. As a result, $V_{REF}$ is turned back up to normal levels considered appropriate for the on state, to permit resumption of on state characteristics. As a result, the present invention allows the current leakage to be substantially decreased in the sleep mode, without permanently affecting the physical characteristics of the chip, adding additional circuit elements (like additional FETs), or affecting the characteristics of the chip when the chip is returned to the on state.

While the invention has been particularly shown and described with reference to preferred embodiments thereof, it will be understood by those skilled in the relevant art that various changes in form and details maybe made therein without departing from the spirit and scope of the invention.

What is claimed is:

1. The semiconductor system, comprising:
   an electronic device;
   a reference circuit receiving an external supply voltage and transmitting a reference voltage;
   a regulator circuit matching an internal supply voltage to said reference voltage;
   a volatile memory communicating with said electronic device and receiving said internal supply voltage;
   electronic circuitry with circuitry which reduces the current flow to one or more diodes in said reference circuit and that reduces said internal supply voltage when the semiconductor system enters a sleep mode from an activated mode and returns said interal supply voltage to an activated mode level with circuitry that increases the current flow to said one or more diodes when the semiconductor returns to said activated mode.

2. The semiconductor system according to claim 1, further comprising:
   electronic circuitry that turns one or more transistors controlling the flow of current to said one or more diodes off when the semiconductor enters the sleep mode from said activated mode; and
   electronic circuitry that turns said one or more transistors back on when the semiconductor reenters said activated mode from the sleep mode.

3. The semiconductor system according to claim 2, further comprising:
   electronic circuitry that turns said transistors on and off by preprogrammed signals transmitted from a control circuit.

* * * * *